(12) United States Patent
Harikai et al.

(10) Patent No.: US 12,230,541 B2
(45) Date of Patent: Feb. 18, 2025

(54) ELEMENT CHIP MANUFACTURING METHOD

(71) Applicant: Panasonic Intellectual Property Management Co., Ltd., Osaka (JP)

(72) Inventors: Atsushi Harikai, Osaka (JP); Shogo Okita, Hyogo (JP); Akihiro Itou, Kyoto (JP); Toshiyuki Takasaki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 477 days.

(21) Appl. No.: 17/456,914

(22) Filed: Nov. 30, 2021

(65) Prior Publication Data

US 2022/0181209 A1 Jun. 9, 2022

(30) Foreign Application Priority Data

Dec. 4, 2020 (JP) .................................. 2020-201996

(51) Int. Cl.
*H01L 21/78* (2006.01)
*H01L 21/304* (2006.01)
*H01L 21/3065* (2006.01)

(52) U.S. Cl.
CPC ............ *H01L 21/78* (2013.01); *H01L 21/304* (2013.01); *H01L 21/3065* (2013.01)

(58) Field of Classification Search
CPC .... H01L 21/78; H01L 21/304; H01L 21/3065
See application file for complete search history.

(56) References Cited

U.S. PATENT DOCUMENTS

| | | | |
|---|---|---|---|
| 9,076,859 B2* | 7/2015 | Harikai | H01J 37/321 |
| 2014/0246153 A1* | 9/2014 | Holden | H01L 21/67092 |
| | | | 156/345.31 |
| 2017/0229365 A1* | 8/2017 | Harikai | H01L 21/78 |
| 2017/0229366 A1* | 8/2017 | Harikai | H01L 21/6835 |
| 2018/0096892 A1* | 4/2018 | Sandoh | H01L 21/3065 |
| 2018/0233395 A1* | 8/2018 | Okita | H01L 21/3065 |
| 2018/0240678 A1* | 8/2018 | Itou | H01L 21/7806 |
| 2019/0074185 A1* | 3/2019 | Karasaki | H01L 21/67069 |
| 2019/0198378 A1* | 6/2019 | Goto | C09J 7/29 |
| 2021/0335667 A1* | 10/2021 | Nakamura | H01L 21/4821 |

FOREIGN PATENT DOCUMENTS

JP 2015-220366 A 12/2015

* cited by examiner

*Primary Examiner* — S M Sohel Imtiaz
(74) *Attorney, Agent, or Firm* — MCDONALD HOPKINS LLC

(57) ABSTRACT

The element chip manufacturing method includes: a preparing process of preparing a substrate 1 including a plurality of element regions EA and a dividing region DA, the substrate 1 having a first principal surface 1X and a second principal surface 1Y; a groove forming process of forming a groove 13 in the dividing region DA from the first principal surface 1X side; and a grinding process of grinding the substrate 1 from the second principal surface 1Y side, to divide the substrate 1 into a plurality of element chips 20. The groove 13 includes a first region 13a constituted by a side surface having a first surface roughness, and a second region 13b constituted by a side surface having a second surface roughness larger than the first surface roughness. In the grinding process, grinding of the substrate 1 is performed until reaching the first region 13a of the groove 13.

4 Claims, 3 Drawing Sheets

ELEMENT CHIP MANUFACTURING METHOD

CROSS REFERENCE TO RELATED APPLICATION

The present application is based on and claims priority under 35 U.S.C. § 119 with respect to the Japanese Patent Application No. 2020-201996 filed on Dec. 4, 2020, of which entire content is incorporated herein by reference into the present application.

TECHNICAL FIELD

The present disclosure relates to an element chip manufacturing method.

BACKGROUND

Conventionally, a method for manufacturing a plurality of element chips by plasma etching a substrate from one surface side thereof, and subsequently grinding the substrate from the other surface side thereof has been known (e.g., Japanese Laid-Open Patent Publication No. 2015-220366). This method is known as a dicing before grinding (DBG) process, in which the substrate is ground using a grinding wheel.

SUMMARY

Here, it is conceivable to apply a Bosch process to plasma etch the substrate in the DBG process. In the Bosch process, a semiconductor layer formed of silicon or the like is etched perpendicularly to the depth direction thereof. In the Bosch process, the semiconductor layer is trenched in the depth direction by sequentially repeating an etching step of isotropically etching the semiconductor layer, a protection film depositing step, and a deposited film removal step. However, in the Bosch process, scallops are formed on side surfaces of each groove. If grinding is performed on a groove with scallops formed thereon in such a manner, the grinding wheel may be caught on the scallops, resulting in a phenomenon in which a portion of a chip is chipped off (hereinafter referred to as "chipping"). In view of such circumstances, it is an object of the present disclosure to inhibit chipping in a DBG process.

As aspect of the present disclosure relates to an element chip manufacturing method. The element chip manufacturing method includes: a preparing process of preparing a substrate including a plurality of element regions and a dividing region that defines the element regions, the substrate having a first principal surface and a second principal surface located opposite to the first principal surface; a groove forming process of forming a groove in the dividing region from the first principal surface side of the substrate; and a grinding process of grinding the substrate from the second principal surface side, to divide the substrate into a plurality of element chips, wherein the groove formed in the groove forming process includes a first region constituted by a side surface having a first surface roughness, and a second region constituted by a side surface having a second surface roughness larger than the first surface roughness, and, in the grinding process, grinding of the substrate is performed until reaching the first region of the groove.

According to the present disclosure, it is possible to inhibit chipping in a DBG process.

DETAILED DESCRIPTION

Figure 1:
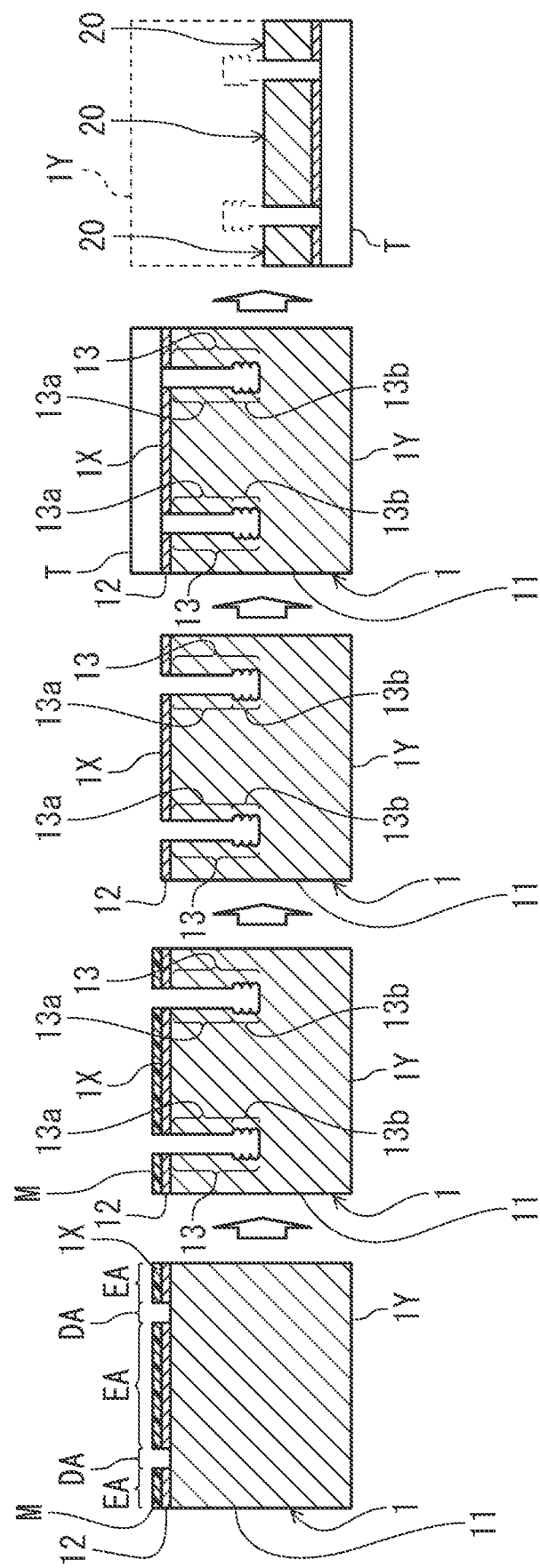
FIG. 1 is a diagram schematically showing an element chip manufacturing method according to Embodiment 1.

Embodiments of the element chip manufacturing method according to the present disclosure will be described below by way of examples. However, the present disclosure is not limited to the examples described below. Although examples of specific numerical values and materials may be given in the following description, other numerical values and materials may be used as long as the effects of the present disclosure can be achieved.

Element Chip Manufacturing Method

The element chip manufacturing method according to the present disclosure includes a preparing process, a groove forming process, and a grinding process. These processes will be described below.

Preparing Process

In the preparing process, a substrate is prepared. The substrate includes a plurality of element regions, and a dividing region that defines the element regions. The substrate has a first principal surface, and a second principal surface located opposite to the first principal surface. The substrate may also include a semiconductor layer, and a device layer stacked on the first principal surface side of the semiconductor layer.

Groove Forming Process

In the groove forming process, a groove is formed in the dividing region from the first principal surface side of the substrate. The groove includes a first region and a second region. The first region is constituted by a side surface having a first surface roughness. The second region is constituted by a side surface having a second surface roughness larger than the first surface roughness. The second surface roughness may be greater than or equal to 10 times the first surface roughness. The groove may be formed halfway in the thickness direction of the semiconductor layer.

Note that the surface roughness as used herein is an arithmetic mean roughness Ra defined in JIS B 0601. That is, the surface roughness as used herein is obtained as follows: A portion of a roughness curve obtained by measuring a groove surface using a roughness meter is cut out at a reference length, and the state of unevenness of the cut-out section is represented by an average value.

Grinding Process

In the grinding process, the substrate is ground from the second principal surface side, to divide the substrate into a plurality of element chips. Thus, the element chip manufacturing method according to the present disclosure is a manufacturing method using a DBG process.

In the grinding process, grinding of the substrate is performed until reaching the first region of the groove. That is, in the grinding process, grinding of the substrate is performed until reaching the first region having a relatively small surface roughness, out of the first region and the second region. A tool used for grinding, such as a grinding wheel, is less likely to be caught on the side surfaces of the first region. Accordingly, with the element chip manufacturing method according to the present disclosure, chipping is less likely to occur.

As described above, according to the present disclosure, it is possible to inhibit chipping in a DBG process.

The groove forming process may include a first plasma processing process of trenching the substrate by continuously etching the substrate, to form the first region; and a second plasma processing process of trenching the substrate by repeating an etching step of etching the substrate, a depositing step of depositing a protection film, and a protection film removing step of removing at least a portion of the protection film, to form the second region. In other words, a first region having no scallop may be formed by a non-Bosch process, and a second region having scallops may be formed by a Bosch process.

The groove forming process may be started from the first plasma processing process. In this case, on side surfaces of each of the finished element chips, end portions on both the first principal surface side and the second principal surface side become relatively smooth. Accordingly, it is possible to increase the transverse rupture strength of the element chips. Note that the groove forming process may be started from the second plasma processing process.

In the groove forming process, the first plasma processing process and the subsequent second plasma processing process may be performed at the end. In the grinding process, grinding of the substrate may be performed until reaching the first region of the groove, the first region having been formed in the first plasma processing process performed last. In this case, the second region formed in the second plasma processing process performed last functions as a preparatory region in the grinding process. That is, even if grinding cannot be performed for a portion of the groove until reaching the first region formed in the first plasma processing process performed last, grinding can be performed until reaching the second region. Accordingly, the substrate can be easily divided into a plurality of element chips.

Note that in the present specification, even if grinding cannot be performed for the entirety of a groove until reaching the first region, it is regarded that grinding is performed until reaching the first region of the groove as long as grinding is performed for most of the groove until reaching the first region (e.g., 85% or more of the entire area of the groove).

In the groove forming process, the first plasma processing process may be performed last. In the grinding process, grinding of the substrate may be performed until reaching the first region of the groove, the first region having been formed in the first plasma processing process performed last. In this case, the second region is formed by the second plasma processing process performed before the first plasma processing process performed last. Since the second region is formed by the second plasma processing process, which is less likely to cause side etching, increasing the length of the second region in the depth direction of the groove has little harmful effect. By adjusting the length of the second region, a groove having a high aspect ratio (e.g., a groove having an aspect ratio of 20 or more) can be easily formed.

As used herein, an aspect ratio refers to a value (D/W) obtained by dividing a depth D of the groove formed in the groove forming process by an opening width W of the groove.

In the groove forming process, the number of times the first plasma processing process and the second plasma processing process are performed may be set freely. In other words, in the groove forming process, the first plasma processing process may be performed once, or twice or more, and the second plasma processing process may be performed once, or twice or more.

In the following, examples of the element chip manufacturing method according to the present disclosure will be described in detail with reference to the drawings. The above-described processes can be applied to the processes of the examples of the element chip manufacturing method described below. The processes of the examples of the element chip manufacturing method described below can be changed based on the above description. The matters described below may be applied to the above-described embodiment. Of the processes of the examples of the element chip manufacturing method described below, processes that are not essential to the element chip manufacturing method according to the present disclosure may be omitted. Note that the drawings described below are schematic views, and do not accurately reflect the actual shapes and the actual numbers of components.

Embodiment 1

As shown in FIG. 1, the element chip manufacturing method includes a preparing process, a groove forming process, a mask removing process, an attaching process, and a grinding process.

Preparing Process

In the preparing process, a substrate 1 is prepared (shown in the left-most view in FIG. 1). The substrate 1 has a first principal surface 1X, and a second principal surface 1Y located opposite to the first principal surface 1X. The substrate 1 includes a plurality of element regions EA, and dividing regions DA that define the element regions EA.

The substrate 1 includes a semiconductor layer 11, and a device layer 12 stacked on the first principal surface 1X side of the semiconductor layer 11. Examples of the semiconductor forming the semiconductor layer 11 include silicon (Si), gallium arsenide (GaAs), gallium nitride (GaN), and silicon carbide (SiC). The device layer 12 is formed in each of the element regions EA.

In each of the element regions EA, a mask M is formed on the device layer 12. Resist, an $SiO_2$ film, a silicon nitride film, a metal thin film, or the like can be used as the mask M. The mask M is formed by a known method according to the type of the constituent material thereof.

Groove Forming Process

In the groove forming process, a groove 13 is formed in each of the dividing regions DA from the first principal surface 1X side of the substrate 1 (shown in the second view from the left in FIG. 1). Each of these grooves 13 includes a first region 13a constituted by a side surface having a first surface roughness, and a second region 13b constituted by a side surface having a second surface roughness. Here, the second surface roughness is larger than the first surface roughness.

The groove forming process includes a first plasma processing process of forming the first regions 13a, and a second plasma processing process of forming the second regions 13b. The groove forming process of the present embodiment is started from the first plasma processing process, and each of the first plasma processing process and the second plasma processing process is performed once. Consequently, grooves 13 each including one first region 13a and one second region 13b in this order from the first principal surface 1X side are formed on the substrate 1.

According to the present embodiment, grooves 13 each having a relatively low aspect ratio are formed. For example, the opening width W of each groove 13 may be 5 to 6 μm, and the depth D of each groove 13 may be 45 to 50 μm. For example, in the depth direction of the grooves 13, the length of each first region 13a may be 30 to 35 μm, and the length of each second region 13b may be 10 to 20 μm.

Plasma Processing Apparatus

Figure 2:
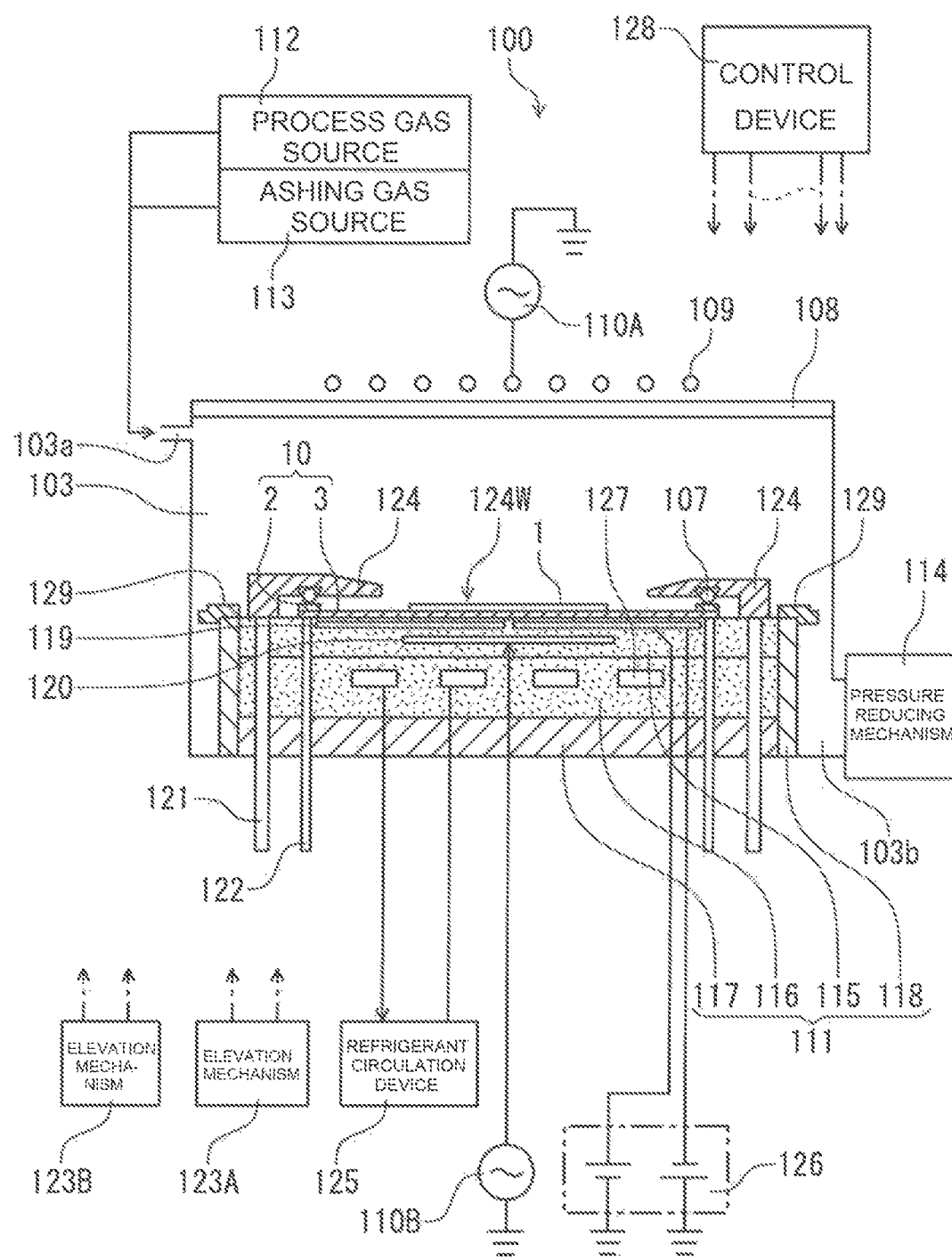
FIG. 2 is a schematic cross-sectional view schematically showing a structure of a plasma processing apparatus used for an element chip manufacturing method.

Here, a plasma processing apparatus 100 used for the plasma processing processes will be specifically described with reference to FIG. 2. However, the plasma processing apparatus is not limited thereto.

The plasma processing apparatus 100 includes a stage 111. The substrate 1 is placed on the stage 111, together with a transport carrier 10 that supports the substrate 1, such that the first principal surface 1X faces upward. Here, the transport carrier 10 is made up of a holding sheet 3 that holds the substrate 1 from the second principal surface 1Y side, and a frame 2 to which the holding sheet 3 is fixed. The stage 111 has a size sufficient to allow the entire transport carrier 10 to be placed thereon.

A cover 124 that covers the frame 2 and at least a portion of the holding sheet 3, and that includes a window portion 124W exposing at least a portion of the substrate 1 is disposed above the stage 111. A retaining member 107 for pressing the frame 2 when the frame 2 is placed on the stage 111 is disposed on the cover 124.

The stage 111 and the cover 124 are disposed inside a vacuum chamber 103. The vacuum chamber 103 has a substantially cylindrical shape with an opening at the top. The opening at the top is closed by a dielectric member 108 serving as a lid member. Examples of the material forming the vacuum chamber 103 include aluminum, stainless steel (SUS), and aluminum having an anodized surface. Examples of the material forming the dielectric member 108 include dielectric materials such as yttrium oxide ($Y_2O_3$), aluminum nitride (AlN), alumina ($Al_2O_3$), and quartz ($SiO_2$). A first electrode 109 serving as an upper electrode is disposed above the dielectric member 108. The first electrode 109 is electrically connected to a first high-frequency power supply 110A. The stage 111 is disposed on the bottom side in the vacuum chamber 103.

The vacuum chamber 103 includes a gas introduction port 103a. A process gas source 112 serving as a supply source of a plasma generating gas and an ashing gas source 113 are connected to the gas introduction port 103a via their respective pipes. In addition, the vacuum chamber 103 includes an exhaust port 103b. A pressure reducing mechanism 114 including a vacuum pump for evacuating the gas inside the vacuum chamber 103 is connected to the exhaust port 103b. Plasma is generated inside the vacuum chamber 103 as a result of high-frequency power being supplied from the first high-frequency power supply 110A to the first electrode 109 in a state in which a process gas is supplied in the vacuum chamber 103.

The stage 111 includes an electrode layer 115 and a metal layer 116 each having a substantially circular shape, a base 117 that supports the electrode layer 115 and the metal layer 116, and an outer peripheral portion 118 that surrounds the electrode layer 115, the metal layer 116, and the base 117. The outer peripheral portion 118 is formed of a metal having conductivity and etching resistance, and protects the electrode layer 115, the metal layer 116, and the base 117 from plasma. An annular outer peripheral ring 129 is disposed on an upper surface of the outer peripheral portion 118. The outer peripheral ring 129 serves to protect the upper surface of the outer peripheral portion 118 from plasma. The electrode layer 115 and the outer peripheral ring 129 are formed of any of the above-described dielectric materials, for example.

An electrostatic chucking electrode (hereinafter referred to as an "ESC electrode 119"), and a second electrode 120 electrically connected to the second high-frequency power supply 110B are disposed inside the electrode layer 115. A direct-current (DC) power supply 126 is electrically connected to the ESC electrode 119. The ESC electrode 119 and the DC power supply 126 constitute an electrostatic chucking mechanism. The holding sheet 3 is pressed against and fixed to the stage 111 by the electrostatic chucking mechanism. Although the following describes a case where the electrostatic chucking mechanism is provided as a fixing mechanism for fixing the holding sheet 3 to the stage 111, the present disclosure is not limited thereto. The holding sheet 3 may be fixed to the stage 111 by means of a clamp, which is not shown.

The metal layer 116 is formed of, for example, aluminum having an alumite coating formed on the surface thereof. A refrigerant flow path 127 is formed inside the metal layer 116. The stage 111 is cooled by a refrigerant flowing through the refrigerant flow path 127. As a result of cooling the stage 111, the holding sheet 3 mounted on the stage 111 is cooled, and the cover 124, a portion of which is in contact with the stage 111, is also cooled. This can prevent the substrate 1 and the holding sheet 3 from being damaged due to overheating during plasma processing. The refrigerant in the refrigerant flow path 127 is circulated by the refrigerant circulation device 125.

A plurality of support portions 122 extending through the stage 111 are disposed in the vicinity of the outer periphery of the stage 111. The support portions 122 support the frame 2 of the transport carrier 10. The support portions 122 are driven to be lifted and lowered by an elevation mechanism 123A. When the transport carrier 10 is transported into the vacuum chamber 103, the transport carrier 10 is transferred to the support portions 122 that are lifted to a predetermined position. By lowering the upper end surfaces of the support portions 122 to the same level as, or a level lower than, that of the stage 111, the transport carrier 10 is placed at a predetermined position on the stage 111.

A plurality of elevation rods 121 that allow the cover 124 to be lifted and lowered are coupled to an end portion of the cover 124. The elevation rods 121 are driven to be lifted and lowered by an elevation mechanism 123B. The operation performed by the elevation mechanism 123B to lift and lower the cover 124 can be performed independently of the operation of the elevation mechanism 123A.

A control device 128 controls operations of the constituent elements of the plasma processing apparatus 100, including the first high-frequency power supply 110A, the second high-frequency power supply 110B, the process gas source 112, the ashing gas source 113, the pressure reducing mechanism 114, the refrigerant circulation device 125, the elevation mechanism 123A, the elevation mechanism 123B, and the electrostatic chucking mechanism. The control device 128 includes a computation device, and a storage device in which a program that can be executed by the computation device is stored.

First Plasma Processing Process

In the first plasma processing process, the substrate 1 is trenched by continuously etching the substrate 1, to form the first regions 13a.

The first plasma processing process is performed, for example, under processing conditions that the pressure inside the vacuum chamber 103 is adjusted to 35 Pa, power of 3600 W is applied to the first electrode 109 from the first high-frequency power supply 110A, and power of 200 W is applied to the second electrode 120 from the second high-frequency power supply 110B, while supplying $SF_6$ at 90 sccm, $O_2$ at 60 sccm, and He at 850 sccm as a raw material gas. Each of the first regions 13a that are formed by etching at this time constitutes a substantially smooth side wall having no scallop.

Second Plasma Processing Process

In the second plasma processing process, the substrate 1 is trenched by repeatedly performing an etching step of etching the substrate 1, a depositing step of depositing a protection film, and a protection film removing step of removing at least a portion of the protection film (e.g., a portion of the protection film that is deposited at the bottom portion of each of the grooves 13), to form the second regions 13b.

The etching step is performed under conditions under which the substrate 1 can be relatively isotropically etched. The etching step is performed, for example, under processing conditions that the pressure inside the vacuum chamber 103 is adjusted to 5 to 25 Pa, power of 1500 to 5000 W is applied to the first electrode 109 from the first high-frequency power supply 110A, power of 20 to 500 W is applied to the second electrode 120 from the second high-frequency power supply 110B, and the etching time is 8 to 15 seconds, while supplying $SF_6$ at 200 to 400 sccm as a raw material gas.

The depositing step is performed, for example, under processing conditions that the pressure inside the vacuum chamber 103 is adjusted to 15 to 25 Pa, power of 1500 to 5000 W is applied to the first electrode 109 from the first high-frequency power supply 110A, power of 0 to 50 W is applied to the second electrode 120 from the second high-frequency power supply 110B, and the deposition time is 2 to 10 seconds, while supplying $C_4F_8$ at 150 to 250 sccm as a raw material gas.

In the protection film removing step, the power applied to the second electrode 120 is higher than the power applied to the second electrode 120 in the etching step. This enables anisotropic etching. The protection film removing step is performed, for example, under processing conditions that the pressure inside the vacuum chamber 103 is adjusted to 5 to 25 Pa, power of 1500 to 5000 W is applied to the first electrode 109 from the first high-frequency power supply 110A, power of 80 to 800 W is applied to the second electrode 120 from the second high-frequency power supply 110B, and the processing time is 2 to 5 seconds, while supplying $SF_6$ at 200 to 400 sccm as a raw material gas.

Thus, in the second plasma processing process, deep trenching in the depth direction is performed by repeating the etching step, the depositing step, the protection film removing step. Since the substrate 1 is likely to be relatively isotropically etched under the etching conditions used in the etching step, the etching of the substrate 1 also proceeds in the horizontal direction (a direction orthogonal to the depth direction) when the substrate 1 is trenched in the depth direction by the etching step. Accordingly, by repeating the etching step, the depositing step, and the protection film removing step, horizontal stripe-like projections and recesses (scallops) are inevitably formed on side walls of each groove 13. Thus, each of the second regions 13b formed by the second plasma processing process constitute a side wall having scallops.

Mask Removing Process

In the mask removing process, the mask M is removed by a known method (shown in the third view from the left in FIG. 1). For example, when the mask M is a resist mask, the mask M may be removed by ashing.

Attaching Process

In the attaching process, a holding tape T is attached to the first principal surface 1X of the substrate 1 (shown in the fourth view from the left in FIG. 1). The area of the holding tape T is the same as, or larger than, the area of the substrate 1. A known holding tape may be used as the holding tape T.

Grinding Process

In the grinding process, the substrate 1 is ground from the second principal surface 1Y side, to divide the substrate 1 into a plurality of element chips 20 (shown in the fifth view from the left in FIG. 1). In the grinding process, grinding of the substrate 1 is performed until reaching the first region 13a of each of the grooves 13. For the grinding process, it is possible to use a known grinding device including a grinding wheel, for example.

Embodiment 2

Embodiment 2 will now be described. The present embodiment is different from Embodiment 1 above with regard to the configuration of the groove forming process and so forth. The following description focuses mainly on differences from Embodiment 1 above.

Figure 3:
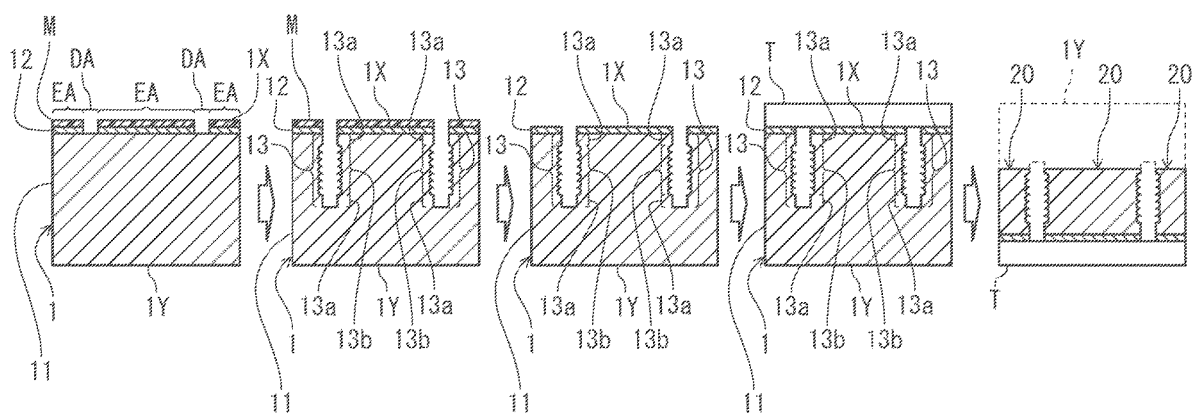
FIG. 3 is a diagram schematically showing an element chip manufacturing method according to Embodiment 2.

As shown in FIG. 3, a groove forming process (shown in the second view from the left in FIG. 3) according to the present embodiment is started from the first plasma processing process, and also, the first plasma processing process, the second plasma processing process, and the first plasma processing process are performed a total of three times in this order. Consequently, grooves 13 each including a total of three regions, namely, a first region 13a, a second region 13b, and a first region 13a in this order from the first principal surface 1X side are formed on the substrate 1.

According to the present embodiment, grooves 13 each having a relatively high aspect ratio are formed. For example, the opening width W of each groove 13 may be 5 to 6 μm, and the depth D of each groove 13 may be 150 μm or more. For example, in the depth direction of each groove 13, the length of each of the first regions 13a may be 10 to 15 μm, and the length of the second region 13b may be 120 to 130 μm. In the grinding process (shown in the fifth view from the left in FIG. 3) of the present embodiment, grinding of the substrate 1 is performed until reaching the first region 13a formed in the first plasma processing process performed for the second time, or in other words, the first plasma processing process performed last.

The present disclosure is applicable to an element chip manufacturing method.

REFERENCE NUMERALS

1: Substrate
1X: First principal surface
1Y: Second principal surface
  11: Semiconductor layer
  12: Device layer
  13: Groove
    13a: First region
    13b: Second region
10: Transport carrier
  2: Frame
  3: Holding sheet
20: Element chip
100: Plasma processing apparatus
  103: Vacuum chamber
    103a: Gas introduction port
    103b: Exhaust port
  107: Retaining member
  108: Dielectric member
  109: First electrode
  110A: First high-frequency power supply
  110B: Second high-frequency power supply
  111: Stage
  112: Process gas source
  113: Ashing gas source
  114: Pressure reducing mechanism
  115: Electrode layer
  116: Metal layer
  117: Base
  118: Outer peripheral portion
  119: ESC electrode
  120: Second electrode
  121: Elevation rod
  122: Support portion
  123A, 123B: Elevation mechanism
  124: Cover
    124W: Window portion
  125: Refrigerant circulation device
  126: DC power supply
  127: Refrigerant flow path
  128: Control device
  129: Outer peripheral ring
DA: Dividing region
EA: Element region
M: Mask
T: Holding tape

What is claimed is:

1. An element chip manufacturing method comprising:
a preparing process of preparing a substrate including a plurality of element regions and a dividing region that defines the element regions, the substrate having a first principal surface and a second principal surface located opposite to the first principal surface, the substrate including a semiconductor layer;
a groove forming process of forming a groove in the dividing region from the first principal surface side of the substrate, the groove being formed halfway in a thickness direction of the semiconductor layer; and
a grinding process of grinding the substrate from the second principal surface side, to divide the substrate into a plurality of element chips,
wherein the groove formed in the groove forming process includes a first region constituted by a side surface having a first surface roughness, and a second region constituted by a side surface having a second surface roughness larger than the first surface roughness in the semiconductor layer,
wherein the groove forming process includes:
a first plasma processing process of trenching the substrate by continuously etching the substrate, to form the first region having no scallop; and
a second plasma processing process of trenching the substrate by repeating an etching step of etching the substrate, a depositing step of depositing a protection film, and a protection film removing step of removing at least a portion of the protection film, to form the second region having scallops and,
in the grinding process, grinding of the substrate is performed until reaching the first region of the groove.

2. The element chip manufacturing method according to claim 1,
wherein the groove forming process is started from the first plasma processing process.

3. The element chip manufacturing method according to claim 1,
wherein, in the groove forming process, the first plasma processing process and the subsequent second plasma processing process are performed last, and,
in the grinding process, grinding of the substrate is performed until reaching the first region of the groove, the first region having been formed in the first plasma processing process performed last.

4. The element chip manufacturing method according to claim 1,
wherein, in the groove forming process, the first plasma processing process is performed last, and,
in the grinding process, grinding of the substrate is performed until reaching the first region of the groove, the first region having been formed in the first plasma processing process performed last.

* * * * *